United States Patent
Jeon et al.

(10) Patent No.: US 11,009,755 B2
(45) Date of Patent: May 18, 2021

(54) DISPLAY DEVICE AND METHOD OF MANUFACTURING THE SAME

(71) Applicant: Samsung Display Co. Ltd., Yongin-si (KR)

(72) Inventors: Hyung Il Jeon, Seoul (KR); Sang Hee Jang, Seoul (KR); Byung Seok Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/364,127

(22) Filed: Mar. 25, 2019

(65) Prior Publication Data

US 2019/0339553 A1 Nov. 7, 2019

(30) Foreign Application Priority Data

May 4, 2018 (KR) .......................... 10-2018-0051710

(51) Int. Cl.
| | |
|---|---|
| *G02F 1/136* | (2006.01) |
| *G02F 1/1362* | (2006.01) |
| *H01L 27/12* | (2006.01) |
| *H01L 29/786* | (2006.01) |

(Continued)

(52) U.S. Cl.
CPC .......... *G02F 1/1362* (2013.01); *G02F 1/1368* (2013.01); *G02F 1/136209* (2013.01); *G02F 1/136227* (2013.01); *H01L 27/124* (2013.01); *H01L 27/1248* (2013.01); *H01L 27/1259* (2013.01); *H01L 29/78633* (2013.01); *G02F 1/13685* (2021.01); *G02F 1/133357* (2021.01); *G02F 1/136222* (2021.01); *G02F 1/136286* (2013.01)

(58) Field of Classification Search
None
See application file for complete search history.

(56) References Cited

U.S. PATENT DOCUMENTS

| | | |
|---|---|---|
| 8,455,870 B2 | 6/2013 | Kim et al. |
| 9,761,650 B2 | 9/2017 | Kwon et al. |
| 9,817,286 B1 | 11/2017 | Shin et al. |

(Continued)

FOREIGN PATENT DOCUMENTS

| | | |
|---|---|---|
| KR | 10-2006-0027214 | 3/2006 |
| KR | 10-2014-0085305 | 7/2014 |

(Continued)

*Primary Examiner* — James A Dudek
(74) *Attorney, Agent, or Firm* — H.C. Park & Associates, PLC

(57) ABSTRACT

A display device includes: a semiconductor layer including source (SR), drain (DR), and channel (CR) regions; a first insulating layer (FIL) on the semiconductor layer; a gate line on the FIL and overlapping the CR; a second insulating layer (SIL) on the gate line; a first contact hole (FCH) in the FIL and the SIL, and exposing the SR; a data line on the SIL and contacting the SR; a third insulating layer (TIL) on the data line; a second contact hole (SCH) in the first to third insulating layers and exposing the DR; a drain electrode on the TIL and contacting the DR; a color filter on the TIL and not overlapping the SCH; a pixel electrode (PE) on the color filter and contacting the drain electrode; and an organic layer on the TIL and the PE. Upper surfaces of the organic layer and the PE are substantially coplanar.

20 Claims, 13 Drawing Sheets

(51) Int. Cl.
*G02F 1/1368* (2006.01)
*G02F 1/1333* (2006.01)

(56) References Cited

U.S. PATENT DOCUMENTS

2018/0011371 A1  1/2018  Noh et al.
2018/0314118 A1* 11/2018  Itou .................... G02F 1/13439

FOREIGN PATENT DOCUMENTS

| KR | 10-1595818    | 2/2016  |
| KR | 10-2017-0058475 | 5/2017  |
| KR | 10-2017-0063308 | 6/2017  |
| KR | 10-2017-0125639 | 11/2017 |
| KR | 10-2017-0126064 | 11/2017 |
| KR | 10-2017-0126632 | 11/2017 |
| KR | 10-2018-0007045 | 1/2018  |

* cited by examiner

DISPLAY DEVICE AND METHOD OF MANUFACTURING THE SAME

CROSS-REFERENCE TO RELATED APPLICATION

This application claims priority from and the benefit of Korean Patent Application No. 10-2018-0051710, filed May 4, 2018, which is hereby incorporated by reference for all purposes as if fully set forth herein.

BACKGROUND

Field

Exemplary embodiments generally relate to a display device and a method of manufacturing the same.

Discussion

With the development of multimedia, display devices are becoming increasingly important. Accordingly, various types of display devices, such as liquid crystal displays (LCDs) and organic light emitting displays (OLEDs), are used. Among display devices, LCDs are widely used types of flat panel displays. An LCD typically includes a pair of substrates having field generating electrodes, such as pixel electrodes and a common electrode, and a liquid crystal layer disposed between the two substrates. Voltages are applied to the field generating electrodes to generate an electric field in the liquid crystal layer. Accordingly, the alignment of liquid crystal molecules in the liquid crystal layer is determined, and polarization of incident light is controlled. As a result, a desired image can be displayed via the LCD.

The above information disclosed in this section is only for understanding the background of the inventive concepts, and, therefore, may contain information that does not form prior art.

SUMMARY

Some exemplary embodiments provide a display device capable of improving reliability.

Some exemplary embodiments provide a method of manufacturing a display device capable of improving reliability.

Additional aspects will be set forth in the detailed description which follows, and, in part, will be apparent from the disclosure, or may be learned by practice of the inventive concepts.

According to some exemplary embodiments, a display device includes a first base, a semiconductor layer, a first insulating layer, a gate line, a second insulating layer, a first contact hole, a data line, a second contact hole, a drain electrode, a color filter, a first pixel electrode, and an organic layer. The first base includes a light blocking area in which a light blocking layer is disposed, and a light transmitting area in which the light blocking layer is not disposed. The semiconductor layer is disposed on the first base in the light blocking area. The semiconductor layer includes a source region, a drain region, and a channel region. The first insulating layer is disposed on the semiconductor layer. The gate line is disposed on the first insulating layer and extends along a first direction. A portion of the gate line overlaps a portion of the channel region. The second insulating layer is disposed on the gate line. The first contact hole is formed in the first insulating layer and the second insulating layer. The first contact hole exposes a portion of the source region. The data line is disposed on the second insulating layer and extends along a second direction intersecting the first direction. A portion of the data line contacts the portion of the source region through the first contact hole. The third insulating layer is disposed on the data line. The second contact hole is formed in the first insulating layer, the second insulating layer, and the third insulating layer. The second contact hole exposes a portion of the drain region. The drain electrode is disposed on the third insulating layer. A portion of the drain electrode contacts the portion of the drain region through the second contact hole. The color filter is disposed on the third insulating layer such that the color filter does not overlap the second contact hole. The first pixel electrode is disposed on the color filter. A portion of the first pixel electrode contacts a portion of the drain electrode. The organic layer is disposed on the third insulating layer and the first pixel electrode. An upper surface of the organic layer is substantially coplanar with an upper surface of the first pixel electrode.

According to some exemplary embodiments, a display device includes a first base, a semiconductor layer, a first insulating layer, a gate line, a second insulating layer, a first contact hole, a data line, a second contact hole, a drain electrode, a color filter, a first pixel electrode, and an organic layer. The semiconductor layer is disposed on the first base and includes a source region, a drain region, and a channel region. The first insulating layer is disposed on the semiconductor layer. The gate line is disposed on the first insulating layer and extends along a first direction. A portion of the gate line overlaps a portion of the channel region. The second insulating layer is disposed on the gate line. The first contact hole is formed in the first insulating layer and the second insulating layer. The first contact hole exposes a portion of the source region. The data line is disposed on the second insulating layer and extends along a second direction intersecting the first direction. A portion of the data line contacts the portion of the source region through the first contact hole. The third insulating layer is disposed on the data line. The second contact hole is formed in the first insulating layer, the second insulating layer, and the third insulating layer. The second contact hole exposes a portion of the drain region. The drain electrode is disposed on the third insulating layer. A portion of the drain electrode contacts the portion of the drain region through the second contact hole. The color filter is disposed on the third insulating layer such that the color filter is disposed in an entirety of the light transmitting area. The first pixel electrode is disposed on the color filter. A portion of the first pixel electrode contacts a portion of the drain electrode. The organic layer is disposed on the third insulating layer in the light blocking area. An upper surface of the organic layer is substantially coplanar with an upper surface of the first pixel electrode.

According to some exemplary embodiments, a method of manufacturing a display device includes: forming a semiconductor layer on a first base, the semiconductor layer including a source region, a drain region, and a channel region; forming a first insulating layer on the semiconductor layer; forming a gate line on the first insulating layer, the gate line extending along a first direction, a portion of the gate line overlapping a portion of the channel region; forming a second insulating layer on the gate line; forming, in the first insulating layer and the second insulating layer, a first contact hole exposing a portion of the source region; forming a data line on the second insulating layer, the data line extending along a second direction intersecting the first direction, a portion of the data line contacting the portion of the source region through the first contact hole; forming a third insulating layer on the data line; forming, in the first insulating layer, the second insulating layer, and the third insulating layer, a second contact hole exposing a portion of the drain region; forming a drain electrode on the third insulating layer, a portion of the drain electrode contacting the portion of the drain region through the second contact hole; forming a color filter on the third insulating layer such that the color filter does not overlap the second contact hole; forming a pixel electrode on the color filter, a portion of the pixel electrode contacting a portion of the drain electrode; and forming an organic layer on the third insulating layer and the pixel electrode. An upper surface of the organic layer is formed substantially coplanar with an upper surface of the first pixel electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
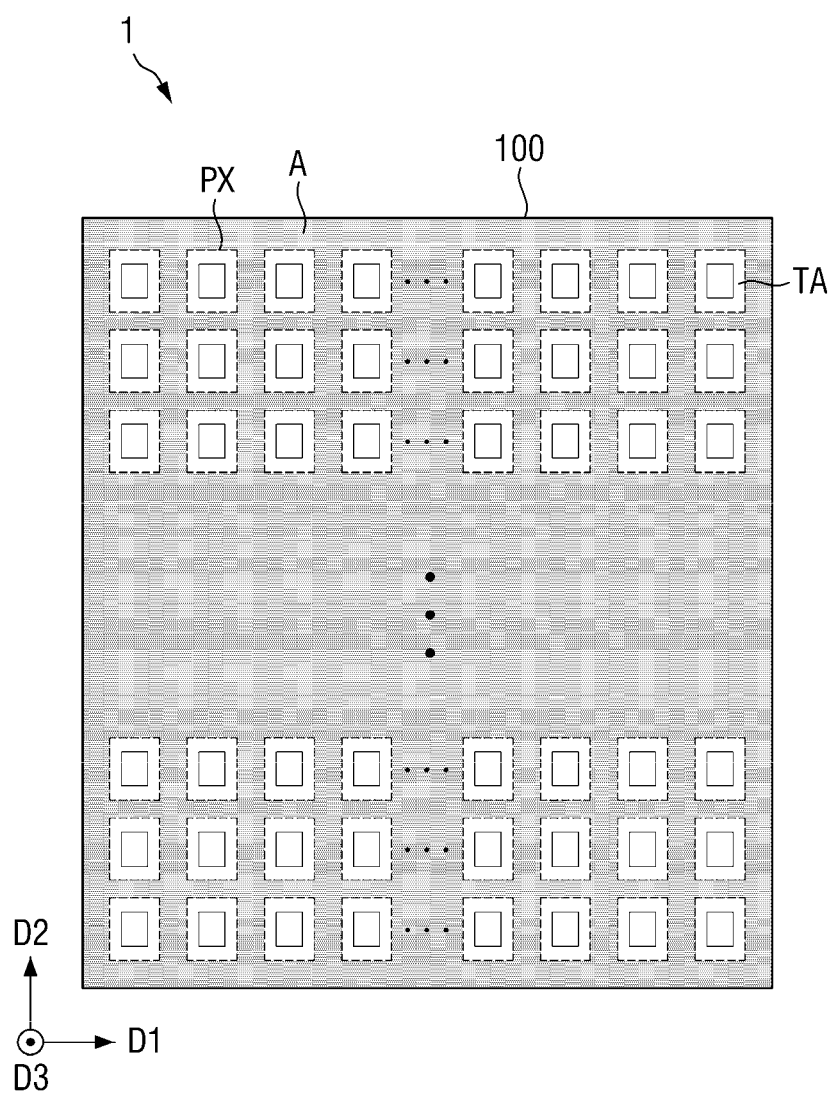
FIG. 1 is a plan view schematically illustrating an arrangement relationship between pixel areas and an area A of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, various exemplary embodiments will be described with reference to the accompanying drawings.

Figure 2:
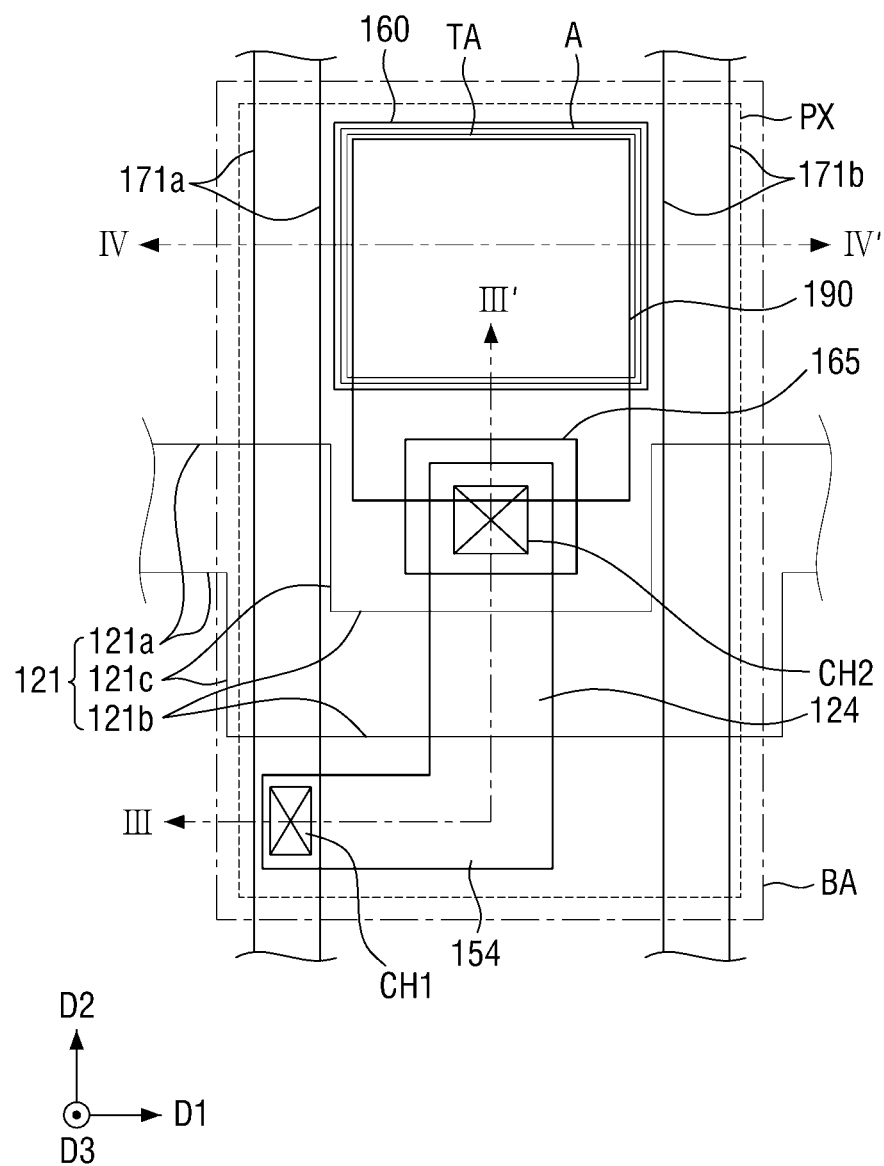
FIG. 2 is an exemplary plan view of a pixel of a display device according to some exemplary embodiments.
Figure 3:
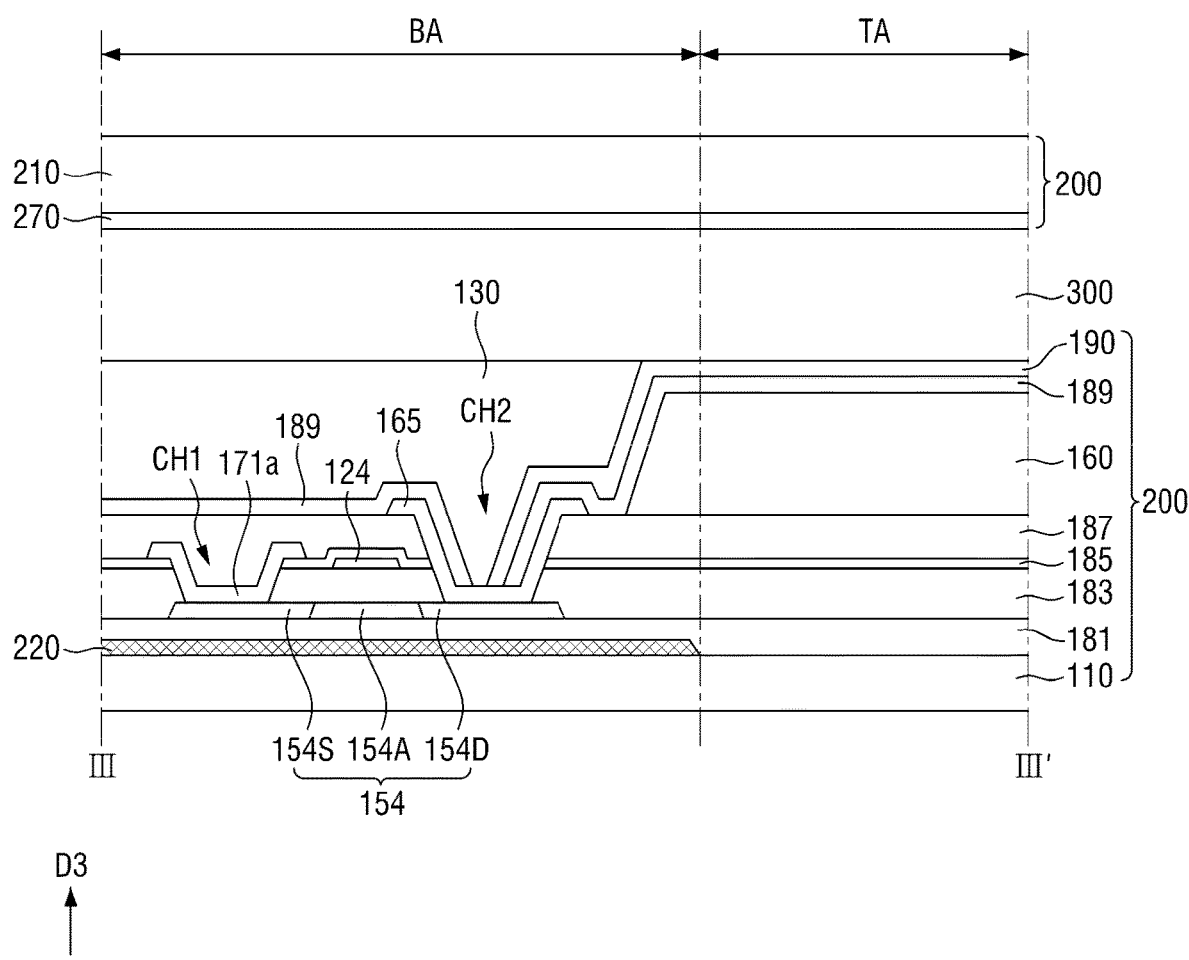
FIG. 3 is across-sectional view taken along sectional line III-III' of the display device illustrated in FIG. 2 according to some exemplary embodiments.
Figure 4:
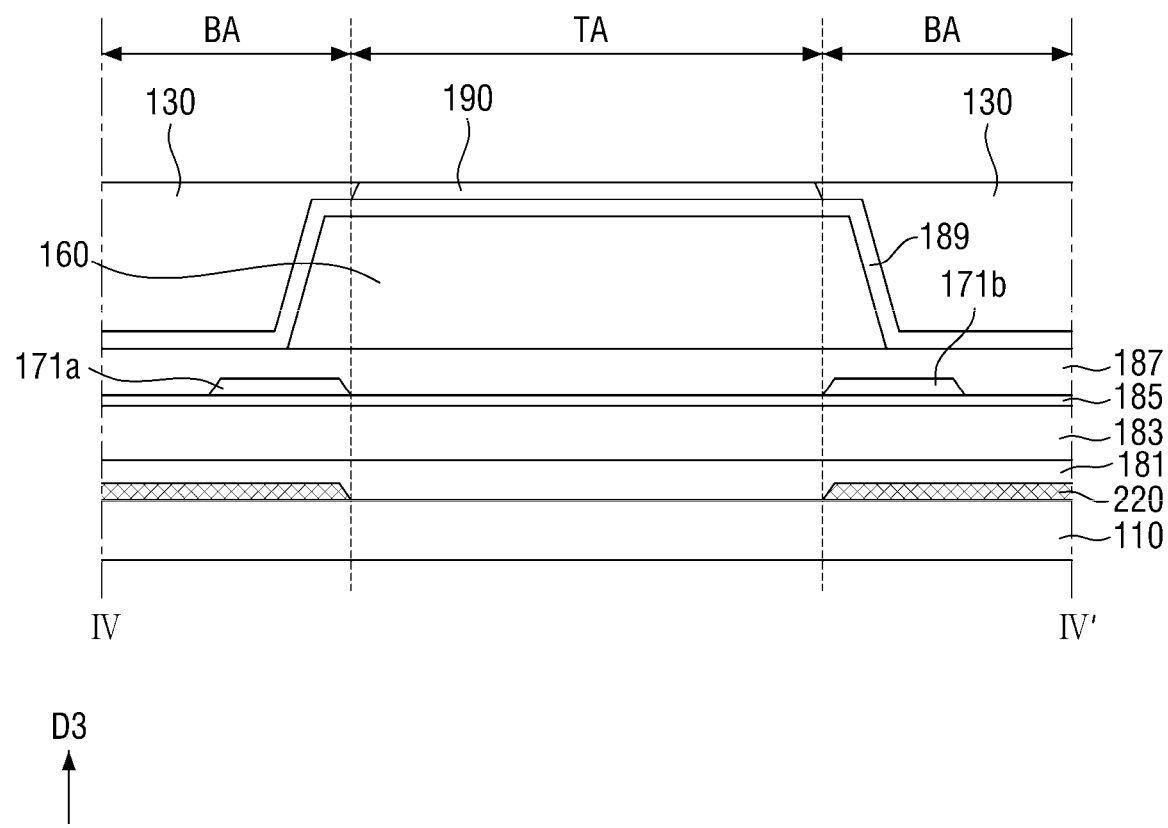
FIG. 4 is a cross-sectional view taken along sectional line IV-IV' of the display device illustrated in FIG. 2 according to some exemplary embodiments.

FIG. 1 is a plan view schematically illustrating an arrangement relationship between pixel areas PX and an area A of a display device according to some exemplary embodiments. FIG. 2 is an exemplary plan view of a pixel of a display device according to some exemplary embodiments. FIG. 3 is a cross-sectional view taken along sectional line III-III' of the display device illustrated in FIG. 2 according to some exemplary embodiments. FIG. 4 is a cross-sectional view taken along sectional line IV-IV' of the display device illustrated in FIG. 2 according to some exemplary embodiments.

Referring to FIGS. 1 through 4, the display device 1 may include a first display substrate 100, a second display substrate 200 facing the first display substrate 100, and a liquid crystal layer 300 located between the first display substrate 100 and the second display substrate 200. The display device 1 may further include a polarizing unit (not shown). The polarizing unit may be provided as an element of any one of the first display substrate 100 and the second display substrate 200. In addition, the display device 1 may further include a backlight unit (not illustrated) located below the first display substrate 100. The backlight unit may be at least one of a backlit (or direct-lit) or an edge-lit structure.

The first display substrate 100 includes the pixel areas PX and the area A where an organic layer 130 is disposed. The organic layer 130 will be described in detail later. A portion of each of the pixel areas PX may overlap the area A. A portion of each of the pixel areas PX that does not overlap the area A may include a light transmitting area TA through which light passes.

The first display substrate 100 may be an array substrate having pixels including elements for driving liquid crystal molecules (not shown) of the liquid crystal layer 300. The elements for diving the liquid crystal molecules may be, for example, switching elements, such as thin-film transistors.

The second display substrate 200 may be a substrate facing the first display substrate 100; that is, a counter substrate.

The first display substrate 100 will now be described in more detail.

A first base 110 may be an insulating substrate, and the insulating substrate may be transparent. For example, the first base 110 may be made of a glass substrate, a quartz substrate, or a transparent resin substrate. In addition, the first base 110 may include polymer or plastic having high thermal resistance. In some exemplary embodiments, the first base 110 may have flexibility. That is, the first base 110 may be a deformable substrate that can be rolled, folded, and/or bent. The ductile transparent insulating material may be, for example, polyimide (PI), polyetherimide (PEI), polyethylene terephthalate (PET), polycarbonate (PC), polymethyl methacrylate (PMMA), polystyrene (PS), styrene acrylonitrile copolymer (SAN), or silicone-acrylic resin. It is also contemplated that the first base 110 may be formed as a single layer or a multilayer structure.

The first base 110 may include the light transmitting area TA and a light blocking area BA. The light transmitting area TA may be an area through which light provided by the backlight unit (not illustrated) located below the first base 110 is transmitted to display an image, and the light blocking area BA may be an area in which light provided by the backlight unit is blocked.

A light blocking layer 220 is located on the first base 110. The light blocking layer 220 may block or absorb light incident from the outside and may overlap the light blocking area BA of the first base 110. The light blocking layer 220 may include any one of opaque metals, such as light absorbing metals or an alloy of these metals, and may have a black-based color. For example, the light blocking layer 220 may be any one of molybdenum (Mo), chromium (Cr), titanium (Ti), niobium (Nb), manganese (Mn), and tantalum, or may be an alloy of one or more of these metals. Alternatively, the light blocking layer 220 may be any other metal capable of absorbing light or any other suitable material.

A buffer layer 181 may be disposed on the first base 110 to cover the light blocking layer 220. The buffer layer 181 prevents (or at least reduces) penetration of impurity elements and planarizes a surface above the first base 110. The buffer layer 181 may be made of various materials capable of playing these roles. For example, the buffer layer 181 may be made of at least one of silicon nitride (SiNx), silicon oxide ($SiO_2$), and silicon oxynitride (SiOxNy).

A semiconductor layer 154 may be located on the buffer layer 181. The semiconductor layer 154 may overlap the light blocking layer 220. Accordingly, light can be blocked from entering the semiconductor layer 154, and the generation of leakage current due to light entering the semiconductor layer 154 can be prevented. The semiconductor layer 154 may be made of at least one semiconductor material selected from the group consisting of polycrystalline silicon, amorphous silicon, and an oxide semiconductor. In addition, the semiconductor layer 154 includes a channel region 154A, which is not doped with an impurity, and a source region 154S and a drain region 154D that are formed on both sides of the channel region 154A and doped with an impurity. Here, the impurity varies according to the type of a thin-film transistor, and an N-type impurity or a P-type impurity can be used.

A first insulating layer 183 may be disposed on the semiconductor layer 154 to cover the semiconductor layer 154. The first insulating layer 183 may insulate the semiconductor layer 154 from a gate line 121 to be described later. The first insulating layer 183 may be made of an inorganic material, such as at least one of silicon nitride (SiNx), silicon oxide ($SiO_2$), silicon oxynitride (SiOxNy), and tetraethyl orthosilicate (TEOS). The first insulating layer 183 may be formed as a single layer or a multilayer structure.

The gate line 121 may be located on the first insulating layer 183. The gate line 121 may transmit a gate signal and extend mainly in one direction. For ease of description, a case where the gate line 121 extends in a horizontal direction or a first direction D1 will, hereinafter, be described as an example. When the gate line 121 extends in the first direction D1, it denotes that the entire gate line 121 extends along the first direction D1 with directionality not only when the entire gate line 121 is parallel to the first direction D1, but also when a portion of the gate line 121 is not parallel to the first direction D1. A gate electrode 124 may protrude from the gate line 121 and may be connected to the gate line 121. In some exemplary embodiments, the gate line 121 may include at least one of an aluminum (Al)-based metal, such as aluminum or an aluminum alloy, a silver (Ag)-based metal, such as silver or a silver alloy, a copper (Cu)-based metal, such as copper or a copper alloy, a molybdenum (Mo)-based metal, such as molybdenum or a molybdenum alloy, a chrome (Cr)-based metal, such as chrome or a chrome alloy, a tantalum (Ta)-based metal, such as tantalum or a tantalum alloy, and a titanium (Ti)-based metal, such as titanium or a titanium alloy.

The gate line 121 may extend in the first direction D1 and have a zigzag shape. For example, the gate line 121 may include a first portion 121a extending substantially parallel to the first direction D1, a second portion 121b extending substantially parallel to the first direction D1 and spaced apart from the first portion 121a, and a third portion 121c connecting the first portion 121a and the second portion 121b. In some exemplary embodiments, the third portion 121c may overlap a first data line 171a or a second data line 171b that will be described later.

The gate line 121 may extend in the first direction D1 and overlap the channel region 154A of the semiconductor layer 154. Although the second portion 121b of the gate line 121 overlaps the channel region 154A of the semiconductor layer 154 in the drawings, exemplary embodiments are not limited to this case, and the first portion 121a can overlap the channel region 154A of the semiconductor layer 154. A portion of the gate line 121 that overlaps the channel region 154A of the semiconductor layer 154 may function as the gate electrode 124 of a thin-film transistor, which will be described later.

A second insulating layer 185 may be located on the gate line 121. The second insulating layer 185 may be made of an insulating material. The insulating material may be, for example, an inorganic material, such as silicon nitride (SiNx), silicon oxide ($SiO_2$), or silicon oxynitride (SiOxNy).

A first contact hole CH1 may be formed in the first insulating layer 183 and the second insulating layer 185 to expose the source region 154S of the semiconductor layer 154.

The first data line 171a and the second data line 171b may be located on the second insulating layer 185 to extend along a second direction D2 intersecting the first direction D1. Data voltages may be provided to the first data line 171a and the second data line 171b.

The first data line 171a may include a third conductive material having excellent electrical conductivity and low electrical resistance. For example, the first data line 171a may include a low-resistivity metal material, such as at least one of tungsten, tantalum, aluminum, copper, silver, and molybdenum, as the third conductive material.

At least a portion of the first data line 171a may directly contact the source region 154S of the semiconductor layer 154 exposed through the first contact hole CH1. Thus, the first data line 171a may be electrically connected to the source region 154S of the semiconductor layer 154. The portion of the first data line 171a that is in contact with the source region 154S may function as a source electrode of the thin-film transistor.

A third insulating layer 187 may be disposed on the first data line 171a, the second data line 171b, and the second insulating layer 185. The third insulating layer 187 may be made of an insulating material. The insulating material may be, for example, an inorganic material, such as at least one of silicon nitride (SiNx), silicon oxide ($SiO_2$), and silicon oxynitride (SiOxNy).

A second contact hole CH2 may be formed in the first insulating layer 183, the second insulating layer 185, and the third insulating layer 187 to expose the drain region 154D of the semiconductor layer 154. In a plan view, the gate line 121 may be located between the first contact hole CH1 and the second contact hole CH2, and the first contact hole CH1 and the second contact hole CH2 may be spaced apart from each other along the second direction D2 intersecting the first direction D1 with the gate line 121 interposed between the first contact hole CH1 and the second contact hole CH2.

A drain electrode 165 may be disposed in the second contact hole CH2. In a plan view, the drain electrode 165 and the first data line 171a may be spaced apart from each other in the first direction D1.

A color filter 160 may be disposed on the third insulating layer 187. In some exemplary embodiments, the color filter 160 may represent one of primary colors, such as one of three primary colors, e.g., one of red, green, and blue. Alternatively, the color filter 160 may represent any one of cyan, magenta, yellow, and white-based colors; however, any suitable color may be utilized in association with exemplary embodiments.

The color filter 160 may not overlap the second contact hole CH2, and, in a plan view, may be spaced apart from the second contact hole CH2 in the second direction D2. In some exemplary embodiments, the color filter 160 may overlap a portion of the light blocking layer 220.

The color filter 160 may include an organic material. The color filter 160 may be thicker than other layers. In this case, a step may be formed between an upper surface of the color filter 160 and an upper surface of the third insulating layer 187.

Although not illustrated in the drawings, an interlayer insulating film may be further located on the drain electrode 165. When the interlayer insulating film is located on the drain electrode 165, the color filter 160 may be located on the interlayer insulating film.

A passivation layer 189 may be disposed on the third insulating layer 187, the drain electrode 165, and the color filter 160. The passivation layer 189 may include an inorganic material. For example, the passivation layer 189 may include at least one of silicon nitride (SiNx), silicon oxide (SiOx), aluminum oxide (AlOx), and titanium oxide (TiOx). The passivation layer 189 may prevent penetration of moisture and/or oxygen.

A pixel electrode 190 may be located on the passivation layer 189. The pixel electrode 190 may overlap the light transmitting area TA and the light blocking area BA. The pixel electrode 190 may be physically and electrically connected to the drain electrode 165 through the second contact hole CH2. The pixel electrode 190 may be made of a transparent conductive material, such as at least one of indium tin oxide (ITO), indium zinc oxide (IZO), indium tin zinc oxide (ITZO), aluminum zinc oxide (AZO), and gallium zinc oxide (GZO). It is also contemplated that one or more conductive polymers (ICP) may be utilized, such as, for example, polyaniline (PANI), poly(3,4-ethylenedioxythiophene) poly(styrenesulfonate) (PEDOT:PSS), etc.

The pixel electrode 190 may be disposed between the first data line 171a and the second data line 171b and may not overlap the first data line 171a and the second data line 171b. However, embodiments are not limited to this case, and at least a portion of the pixel electrode 190 can overlap the first data line 171a and/or the second data line 171b.

The organic layer 130 may be disposed on the passivation layer 189. The organic layer 130 may be disposed in most areas excluding the light transmitting area TA. In other words, the organic layer 130 may cover most of the light blocking area BA.

The organic layer 130 may partially overlap the color filter 160 in cross-section. The organic layer 130 may be disposed to reduce a step formed by the color filter 160 and to cover side surfaces of the color filter 160. An upper surface of the organic layer 130 and the upper surface of the color filter 160 may lie in substantially one plane. In other words, the upper surface of the organic layer 130 may be substantially aligned with the upper surface of the color filter 160. That is, a distance from the upper surface of the third insulating layer 187 to the upper surface of the organic layer 130 may be substantially equal to a distance from the upper surface of the third insulating layer 187 to the upper surface of the color filter 160. Further, a distance from an upper surface of the first base 110 to the upper surface of the organic layer 130 may be substantially equal to a distance from the upper surface of the first base 110 to the upper surface of the color filter 160.

In some exemplary embodiments, the organic layer 130 may function as a planarization film. The organic layer 130 may include an organic material. In some exemplary embodiments, the organic material may be a photosensitive organic material. For instance, the organic layer 130 may be a negative photosensitive organic material or a positive photosensitive organic material. This will be described in detail later.

As described above, the color filter 160 may have more than a certain level of thickness. In this case, a step may be formed between the upper surface of the third insulating layer 187 and the upper surface of the color filter 160. The step formed by the color filter 160 may cause the liquid crystal layer 300 to be unevenly disposed along the side slopes of the color filter 160. This may cause light leakage in the side slope portions of the color filter 160, thereby deteriorating the quality of the display device 1.

On the other hand, if the organic layer 130 is present, the step formed by the color filter 160 may be reduced, and the liquid crystal layer 300 is not disposed along the side slopes of the color filter 160. Accordingly, the liquid crystal layer 300 can be evenly disposed and aligned in the entire area of the display device 1, and the occurrence of light leakage in the side slope portions of the color filter 160 can be prevented.

Next, the second display substrate 200 will be described.

The second display substrate 200 may include a second base 210 and a common electrode 270.

Like the first base 110, the second base 210 may be a transparent insulating substrate. In addition, the second base 210 may include polymer or plastic having high thermal resistance. In some exemplary embodiments, the second base 210 may have flexibility. It is also contemplated that the second base 210 may be formed as a single layer or a multilayer structure.

The common electrode 270 may be located on a surface of the second base 210 that faces the first display substrate 100. The common electrode 270 may be made of a transparent conductive material, such as ITO or IZO. In some exemplary embodiments, the common electrode 270 may be formed on the entire surface of the second base 210. A common voltage Vcom may be applied to the common electrode 270 to form an electric field together with the pixel electrode 190.

The liquid crystal layer 300 may be disposed between the first display substrate 100 and the second display substrate 200. The liquid crystal layer 300 may include a plurality of liquid crystal molecules having dielectric anisotropy. When an electric field is applied between the first display substrate 100 and the second display substrate 200, the liquid crystal molecules may rotate in a specific direction between the first display substrate 100 and the second display substrate 200, thereby transmitting or blocking light. Here, the term "rotate" may denote not only that the liquid crystal molecules actually rotate, but also that the arrangement of the liquid crystal molecules is changed by the electric field.

A method of manufacturing the display device 1 illustrated in FIGS. 1 through 4 will now be described.

FIGS. 5 through 14 are respective cross-sectional views of a display device taken along sectional line III-III' illustrated in FIG. 2 at various stages of manufacture according to some exemplary embodiments.

Figure 5:
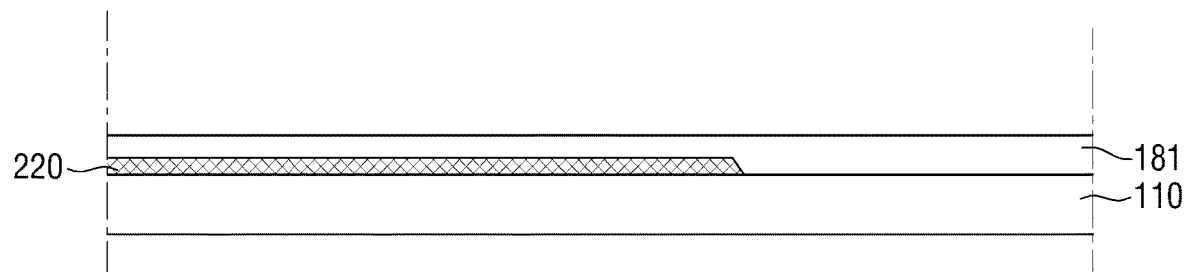
FIGS. 5 through 14 are respective Toss-sectional views of a display device taken along sectional line III-III' illustrated in FIG. 2 at various stages of manufacture according to some exemplary embodiments.

Referring to FIG. 5, a light blocking layer 220 is formed on a surface of a first base 110, and a buffer layer 181 is formed on the light blocking layer 220.

Figure 6:
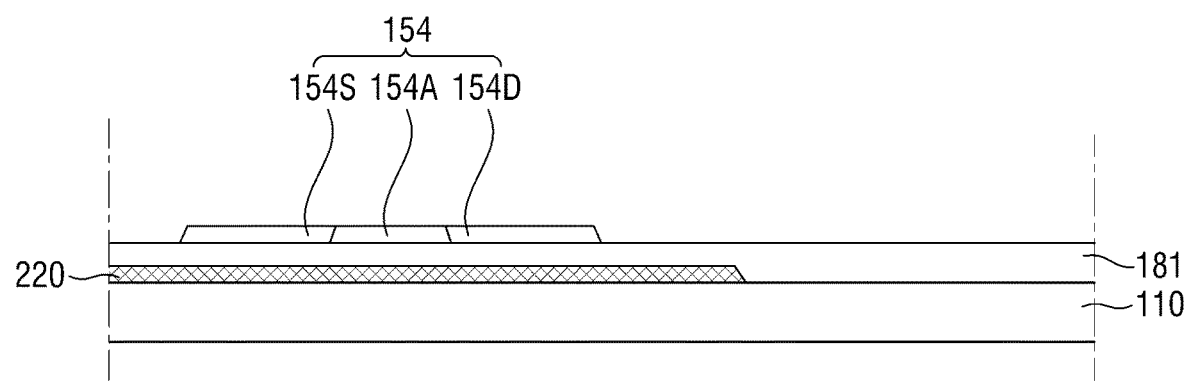

As seen in FIG. 6, a semiconductor layer 154 is formed on the buffer layer 181 to overlap the light blocking layer 220. The semiconductor layer 154 includes a source region 154S, a drain region 154D, and a channel region 154A. The source region 154S and the drain region 154D may be formed by doping impurity ions.

Figure 7:
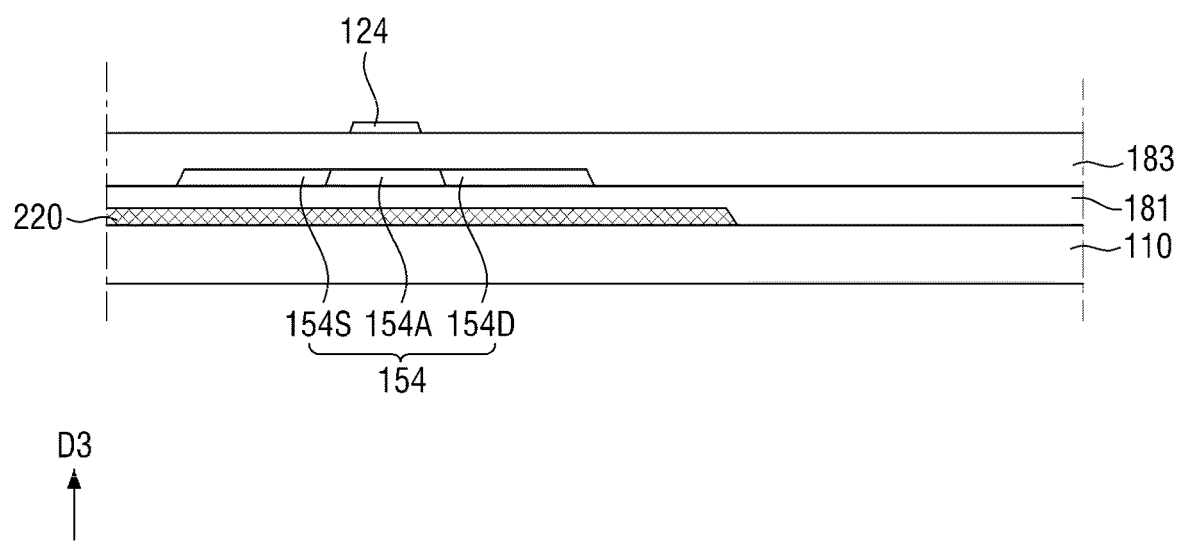

Referring to FIG. 7, a first insulating layer 183 is formed on the semiconductor layer 154 and the buffer layer 181. The first insulating layer 183 may be made of an inorganic material, such as silicon nitride (SiNx), silicon oxide (SiO$_2$), or silicon oxynitride (SiOxNy). In some exemplary embodiments, the first insulating layer 183 may be formed by a high density plasma (HDP) method.

A gate line 121 is formed on the first insulating layer 183. The gate line 121 may extend in a first direction D1 (see FIG. 1) and may be formed in a zigzag shape. The gate line 121 may be formed to overlap the channel region 154A of the semiconductor layer 154. A portion of the gate line 121 overlapping the channel region 154A of the semiconductor layer 154 may correspond to a gate electrode 124.

Figure 8:
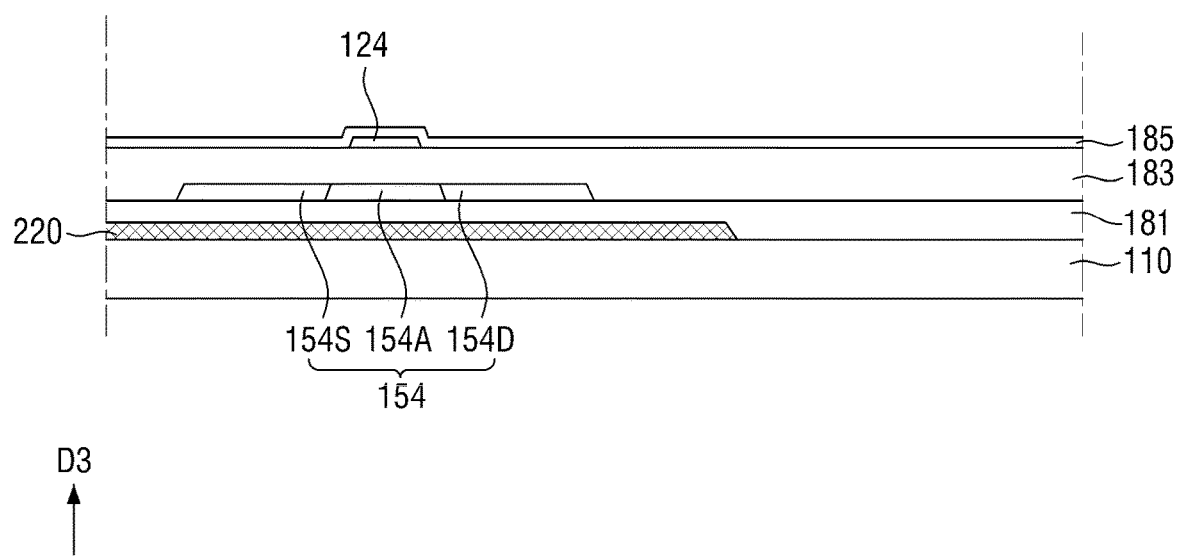

Adverting to FIG. 8, a second insulating layer 185 is formed on the first insulating layer 183 to cover the gate line 121 including the gate electrode 124. The second insulating layer 185 may be made of an inorganic material, such as silicon nitride (SiNx), silicon oxide (SiO$_2$), or silicon oxynitride (SiOxNy). In some exemplary embodiments, the second insulating layer 185 may be formed by a plasma chemical vapor deposition (CVD) method.

Figure 9:
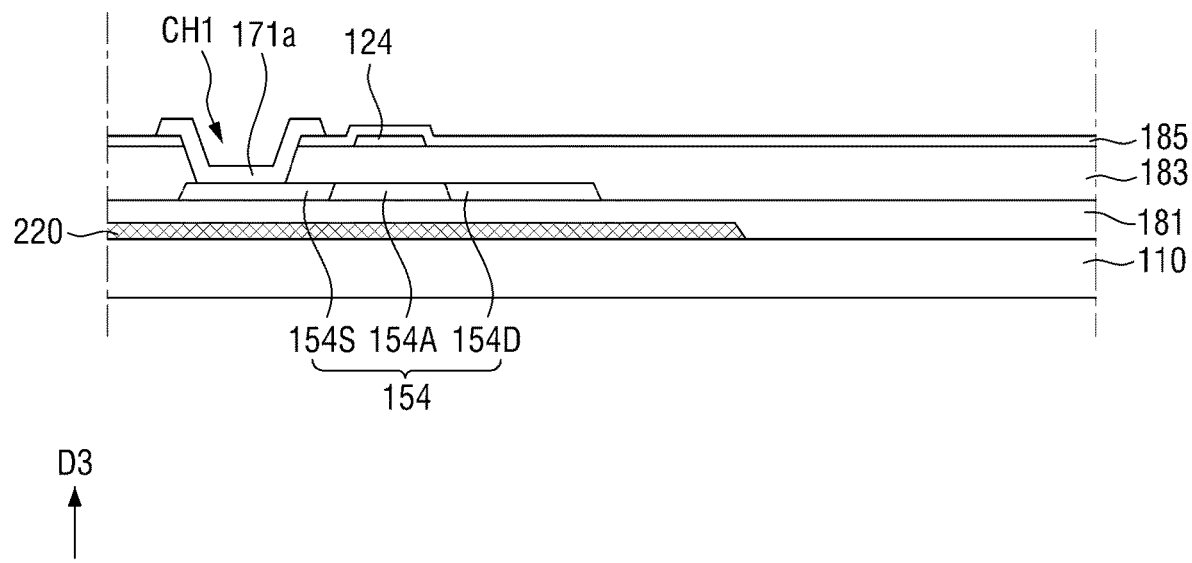

Referring to FIG. 9, a first contact hole CH1 is formed in the first insulating layer 183 and the second insulating layer 185 to expose the source region 154S. As illustrated in FIG. 2, a plurality of data lines, for instance, a first data line 171a and a second data line 171b, is formed to extend in a second direction D2 intersecting the first direction D1.

At least a portion of the first data line 171a may be disposed inside the first contact hole CH1 and may be physically and electrically connected to the source region 154S of the semiconductor layer 154 exposed through the first contact hole CH1. Therefore, a portion of the first data line 171a may function as a source electrode of a thin-film transistor.

Figure 10:
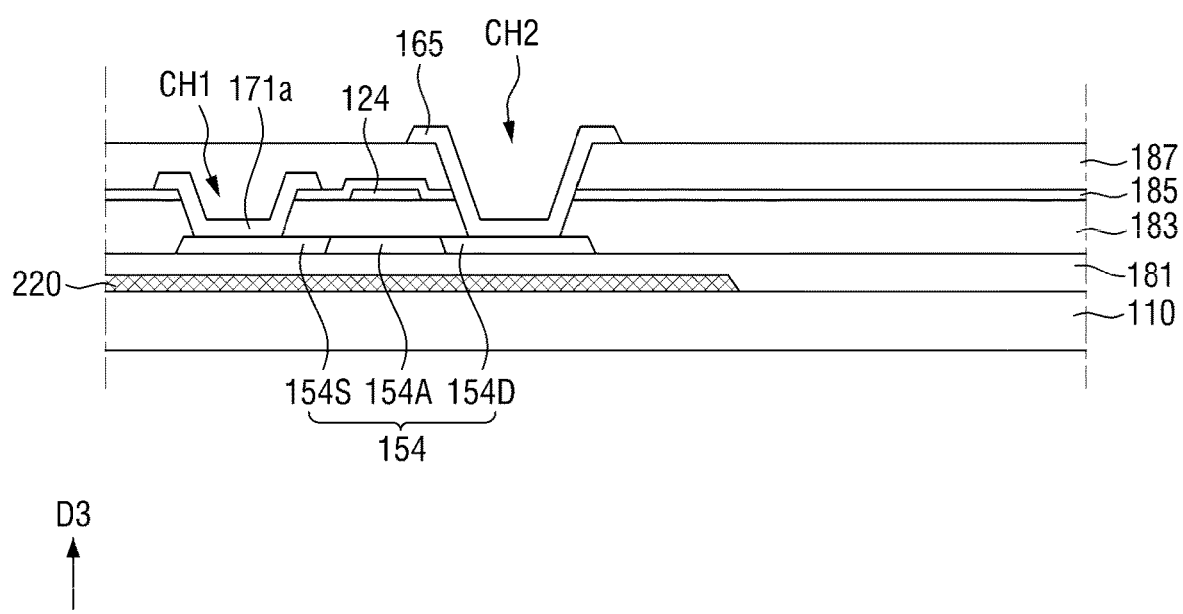

As seen in FIG. 10, a third insulating layer 187 is formed on the second insulating layer 185 and the first and second data lines 171a and 171b. A second contact hole CH2 is formed in the first insulating layer 183, the second insulating layer 185, and the third insulating layer 187 to expose the drain region 154D of the semiconductor layer 154. A drain electrode 165 is disposed to overlap the second contact hole CH2. The drain electrode 165 may be physically and electrically connected to the drain region 154D of the semiconductor layer 154 exposed through the second contact hole CH2.

Figure 11:
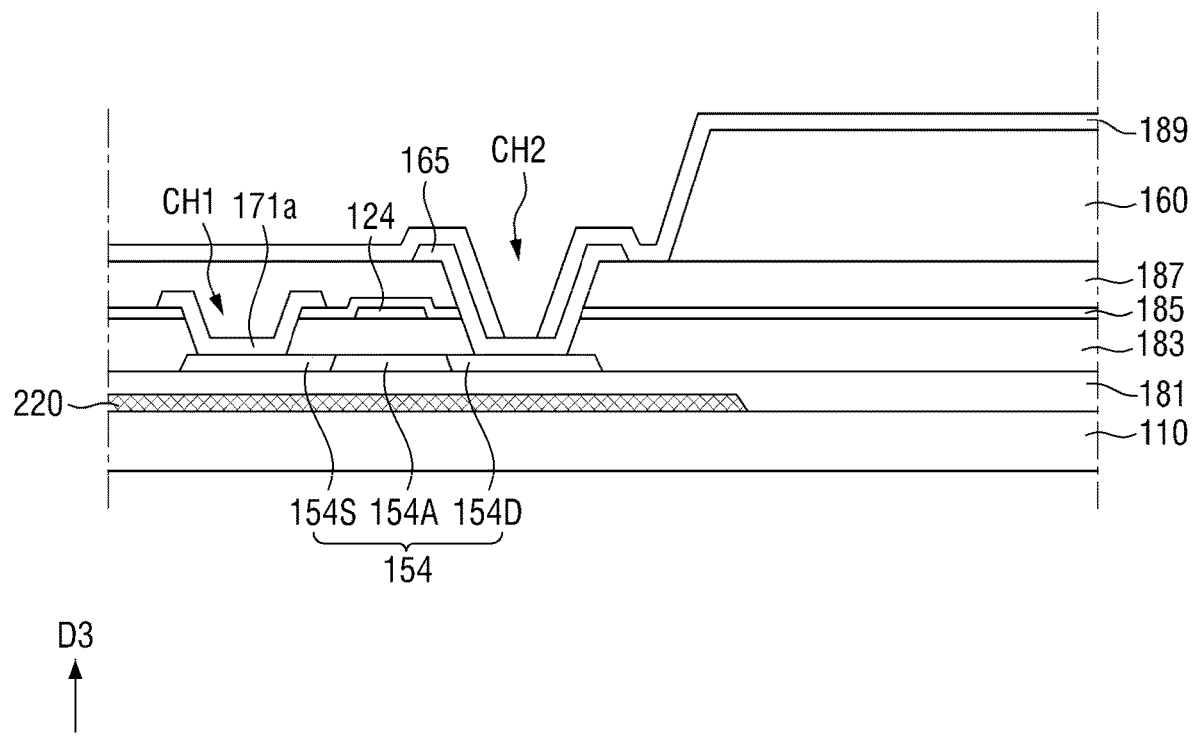

Referring to FIG. 11, a color filter 160 is formed on the third insulating layer 187 having the second contact hole CH2 and the drain electrode 165. The color filter 160 overlaps a portion of the light blocking layer 220, but does not overlap the second contact hole CH2 as described above. The color filter 160 may include an organic material and may include a colorant having a color.

A passivation layer 189 is formed on the color filter 160 and a portion of the third insulating layer 187 on which the color filter 160 is not formed. The passivation layer 189 may be made of an inorganic material, such as silicon nitride (SiNx), silicon oxide (SiO$_2$), or silicon oxynitride (SiOxNy). In some exemplary embodiments, the passivation layer 189 may be formed by a plasma CVD method.

Figure 12:
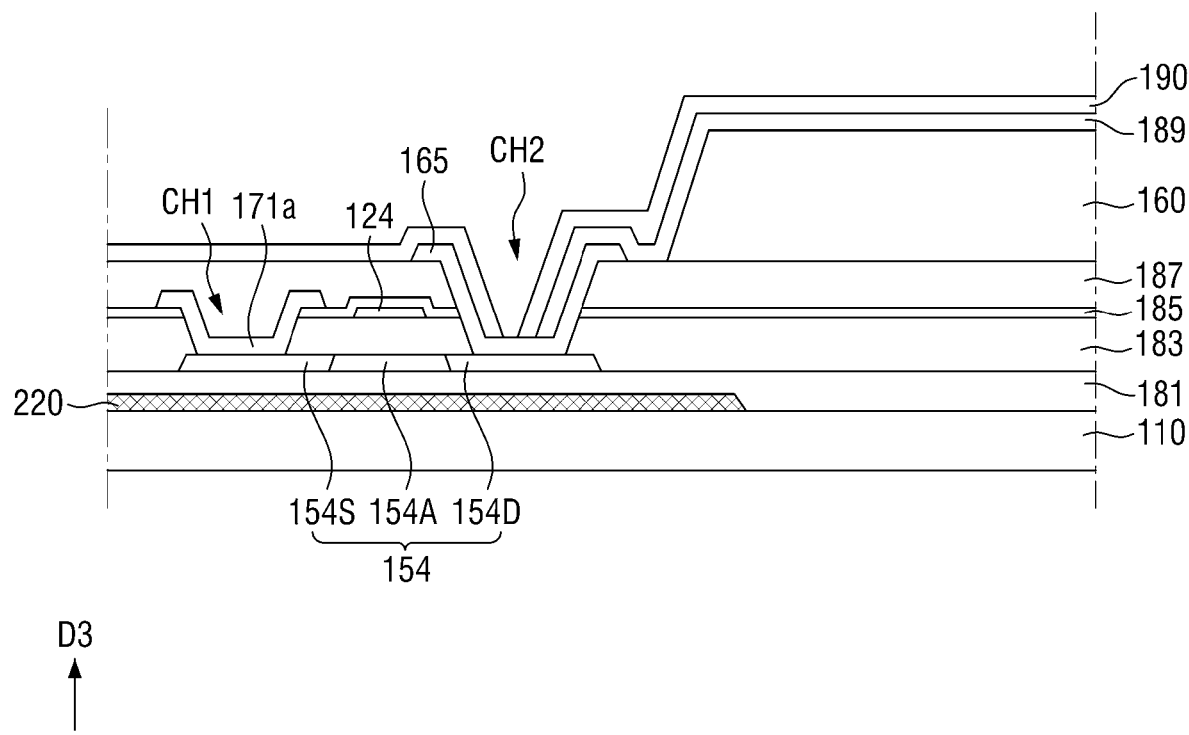

Adverting to FIG. 12, a transparent conductive material is deposited on the passivation layer 189 and then patterned to form a pixel electrode 190. The pixel electrode 190 may be physically and electrically connected to the drain electrode 165 through the second contact hole CH2.

Figure 13:
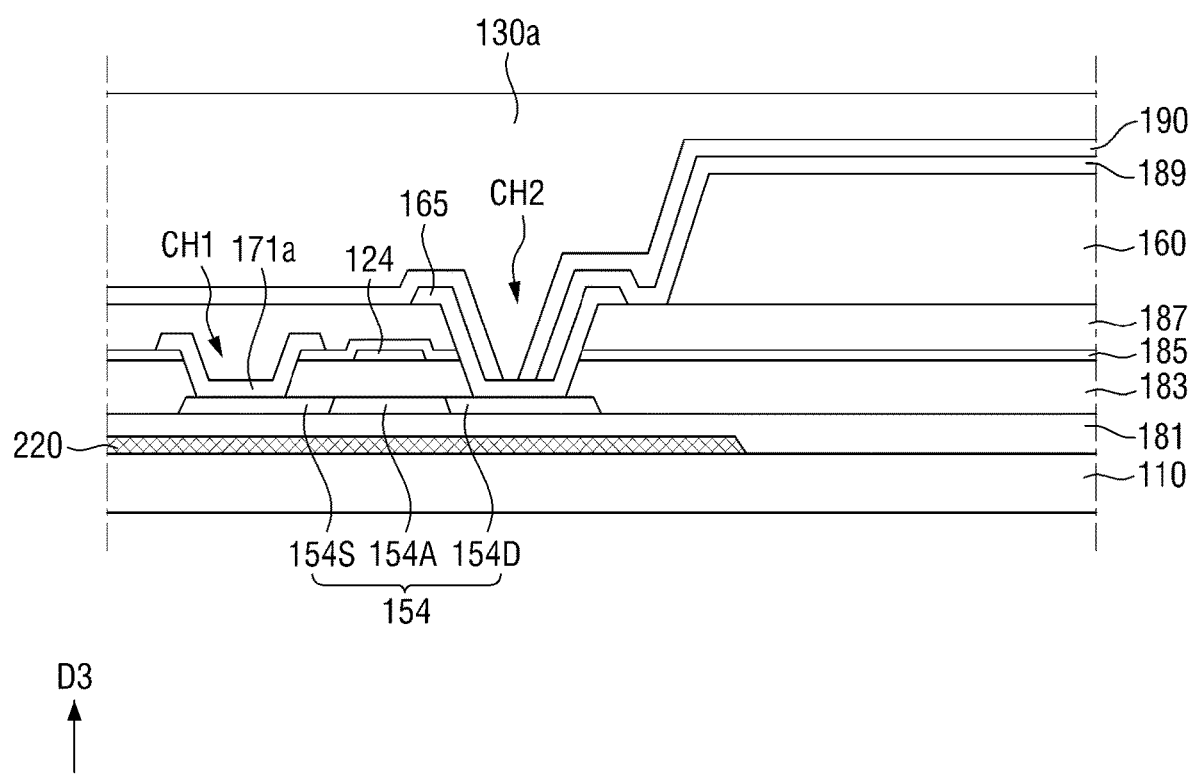

Referring to FIG. 13, an organic material layer 130a is formed by depositing an organic material on the entire surface of the first display substrate 100. As described above, the organic material layer 130a includes a photosensitive organic material, and the organic material may be a negative photosensitive organic material or a positive photosensitive organic material.

The organic material layer 130a may be formed to cover the whole of the passivation layer 189 and the pixel electrode 190. In addition, in a plan view, the organic material layer 130a may overlap the entire color filter 160. A distance from an upper surface of the third insulating layer 187 to an upper surface of the organic material layer 130a may be greater than a distance from the upper surface of the third insulating layer 187 to an upper surface of the color filter 160. In other words, the organic material layer 130a is thicker than the color filter 160 in an area where the color filter 160 is not disposed.

Figure 14:
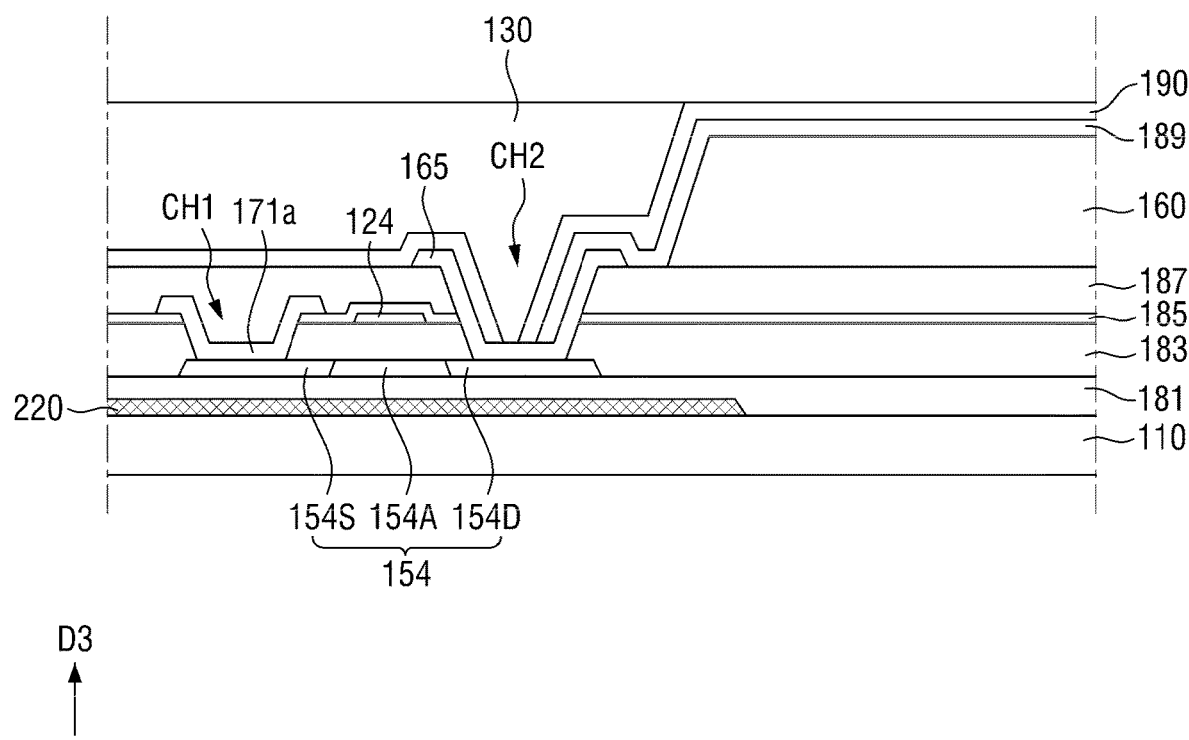

As seen in FIG. 14, an organic layer 130 is formed by exposing the organic material layer 130a to light and removing unnecessary portions. For example, when the organic material layer 130a includes a negative photosensitive organic material, the organic layer 130 may be formed by curing the organic material by under-exposing the organic material layer 130a in an area where the organic layer 130 is to be formed and by removing an unexposed portion of the organic material layer 130a. Alternatively, when the organic material layer 130a includes a positive photosensitive organic material, the organic layer 130 may be formed by exposing the organic material layer 130a in an area other than the area where the organic layer 130 is to be formed and removing the exposed organic layer 130a.

Accordingly, the first display substrate 100 (see FIGS. 1 and 3) illustrated in FIGS. 1 through 4 is formed to produce the display device 1.

Figure 15:
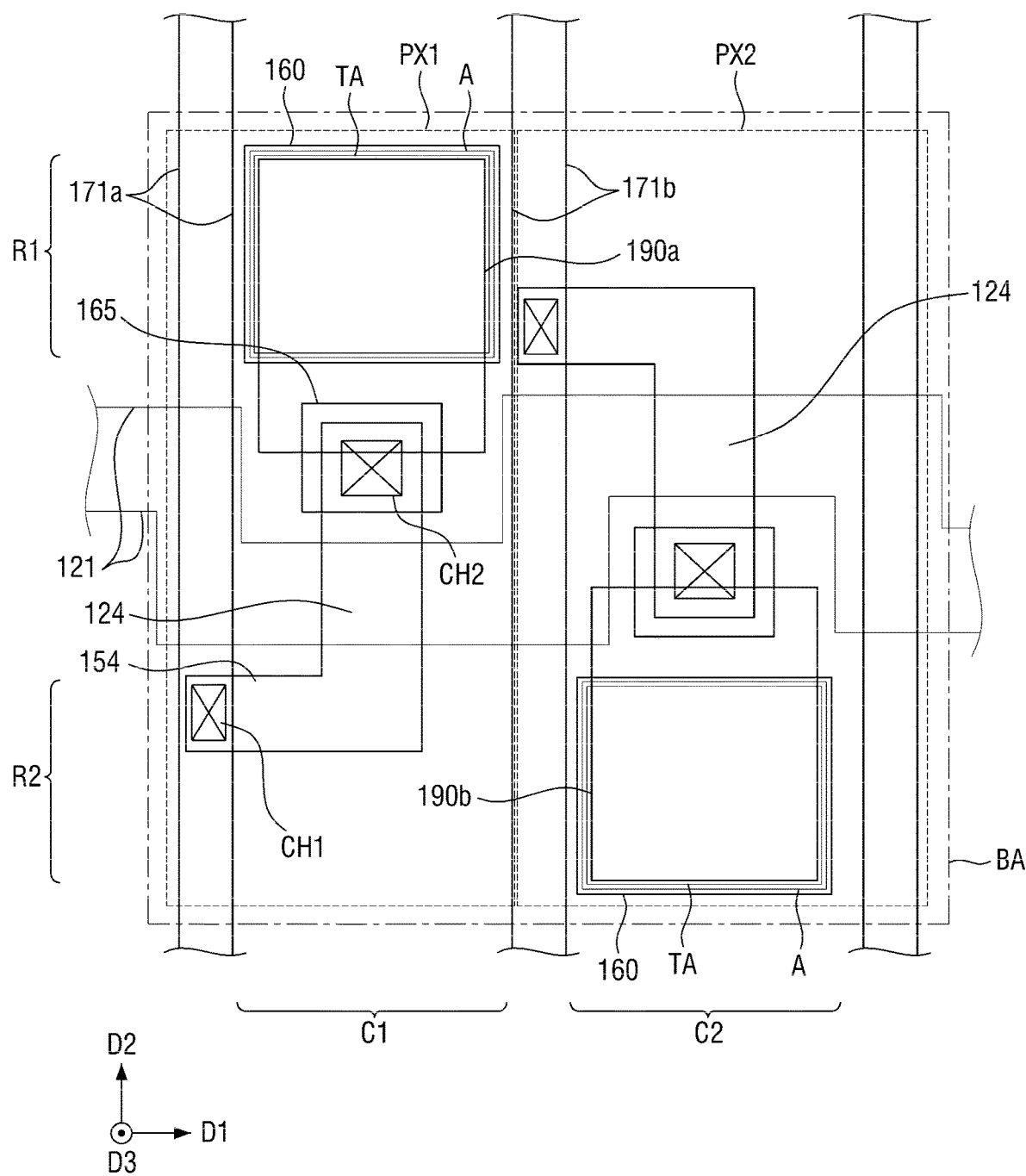
FIG. 15 is a schematic plan view of neighboring pixels in a display device according to some exemplary embodiments.

FIG. 15 is a schematic plan view of neighboring pixels in a display device according to some exemplary embodiments.

Referring to FIG. 15, a first pixel and a second pixel may be located adjacent to each other along a first direction D1. The first pixel may be connected to a first data line 171a and a gate line 121, and the second pixel may be connected to a second data line 171b and the gate line 121. That is, the first pixel and the second pixel may be connected to the same gate line 121 and may be located adjacent to each other along the first direction D1 in which the gate line 121 extends.

The structure of the first pixel is the same as that described above with reference to FIGS. 1 through 4, and the structure of the second pixel is substantially the same as that of the first pixel. Thus, a detailed description of the structures of the first and second pixels will be omitted.

The first pixel and the second pixel may be symmetrical in shape to each other. For example, the first pixel and the second pixel may be axially symmetrical to each other with respect to an imaginary line extending along the first direction D1. For example, the shape of a first pixel electrode 190a of the first pixel and the shape of a second pixel electrode 190b of the second pixel may be axially symmetrical to each other with respect to an imaginary line extending along the first direction D1. The first pixel electrode 190a and the second pixel electrode 190b may be disposed in different rows and in different columns.

For example, when the first pixel electrode 190a is located in a first row R1 as illustrated in FIG. 15, the second pixel electrode 190b may not be located in the first row R1 and may be located in a second row R2 adjacent to the first row R1 along a second direction D2. In addition, when the first pixel electrode 190a is located in a first column C1, the second pixel electrode 190b may not be located in the first column C1 and may be located in a second column C2 adjacent to the first column C1 along the first direction D1.

That is, the first pixel electrode 190a and the second pixel electrode 190b are not disposed adjacent to each other along the first direction D1 and the second direction D2, but are disposed adjacent to each other along a diagonal direction. Accordingly, a distance between the adjacent pixel electrodes 190a and 190b is increased. The increased distance can minimize (or at least reduce) the electric field interference and motion interference of liquid crystal molecules between adjacent pixels.

Figure 16:
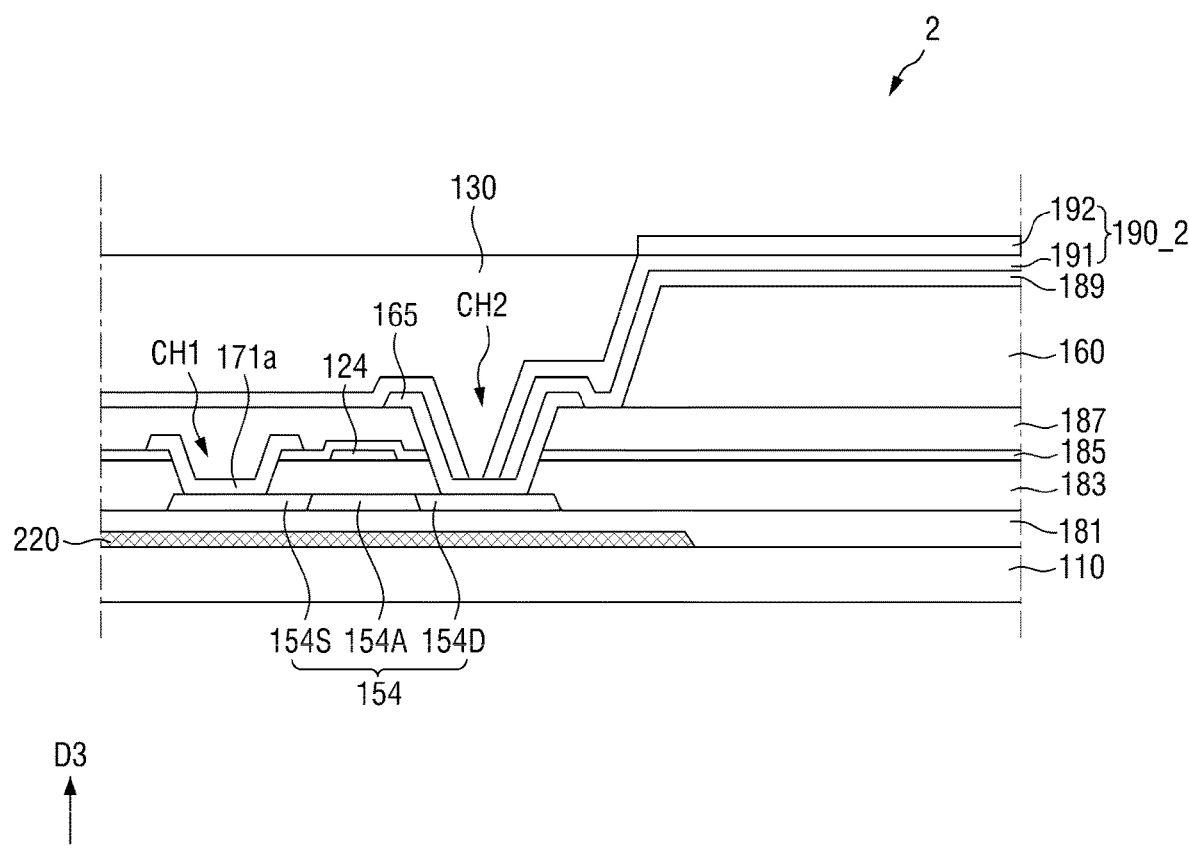
FIG. 16 is a cross-sectional view of a display device according to some exemplary embodiments.

FIG. 16 is a cross-sectional view of a display device according to some exemplary embodiments.

Referring to FIG. 16, a pixel electrode 190_2 of the display device 2 may include a lower pixel electrode 191 and an upper pixel electrode 192. The upper pixel electrode 192 may be disposed on the lower pixel electrode 191. The upper pixel electrode 192 may cover most of an upper surface of the lower pixel electrode 191.

The upper pixel electrode 192 is disposed on an organic layer 130. A portion of the upper pixel electrode 192 may overlap the organic layer 130 or may not overlap the organic layer 130 as illustrated in FIG. 16. Since the upper pixel electrode 192 is disposed on the organic layer 130, it does not directly contact a drain electrode 165 through a second contact hole CH2. The upper pixel electrode 192 may be physically and electrically connected to the lower pixel electrode 191 and may be electrically connected to the drain electrode 165 through the lower pixel electrode 191.

According to various exemplary embodiments, it is possible to provide a display device in which a visible portion of a non-display area is reduced. Further, according to various exemplary embodiments, it is also possible to provide a display device with improved reliability.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a first base;
a semiconductor layer disposed on the first base, the semiconductor layer comprising a source region, a drain region, and a channel region;
a first insulating layer disposed on the semiconductor layer;
a gate line disposed on the first insulating layer and extending along a first direction, a portion of the gate line overlapping a portion of the channel region;
a second insulating layer disposed on the gate line;
a first contact hole formed in the first insulating layer and the second insulating layer, the first contact hole exposing a portion of the source region;
a data line disposed on the second insulating layer and extending along a second direction intersecting the first direction, a portion of the data line contacting the portion of the source region through the first contact hole;
a third insulating layer disposed on the data line;
a second contact hole formed in the first insulating layer, the second insulating layer, and the third insulating layer, the second contact hole exposing a portion of the drain region;
a drain electrode disposed on the third insulating layer, a portion of the drain electrode contacting the portion of the drain region through the second contact hole;
a color filter disposed on the third insulating layer such that the color filter does not overlap the second contact hole;
a first pixel electrode disposed on the color filter, a portion of the first pixel electrode contacting a portion of the drain electrode; and
an organic layer disposed on the third insulating layer and the first pixel electrode,
wherein the organic layer is horizontally adjacent to the third insulating layer and the color filter, and horizontally overlaps the third insulating layer and the color filter.

2. The display device of claim 1, wherein an upper surface of the organic layer is substantially coplanar with an upper surface of the first pixel electrode, and
wherein a distance from a surface of the first base to the upper surface of the organic layer is substantially equal to a distance from the surface of the first base to the upper surface of the first pixel electrode.

3. The display device of claim 1, wherein the gate line has a zigzag shape.

4. The display device of claim 1, wherein an upper surface of the organic layer is substantially coplanar with an upper surface of the first pixel electrode, and
wherein a distance from an upper surface of the third insulating layer to the upper surface of the organic layer is substantially equal to a distance from the upper surface of the third insulating layer to the upper surface of the first pixel electrode.

5. The display device of claim 1, wherein the organic layer comprises a photosensitive organic material.

6. The display device of claim 1, further comprising:
a light blocking layer disposed on the first base, a portion of the light blocking layer overlapping with the semiconductor layer; and
a buffer layer disposed on the light blocking layer,
wherein the buffer layer disposed between the semiconductor layer and the light blocking layer.

7. The display device of claim 6, wherein the light blocking layer comprises an opaque metal.

8. The display device of claim 6, wherein:
the first base comprises:
a light blocking area in which the light blocking layer is disposed; and
a light transmitting area in which the light blocking layer is not disposed; and
the organic layer is disposed only in the light blocking area.

9. The display device of claim 8, wherein a portion of the organic layer overlaps the first contact hole and the second contact hole.

10. The display device of claim 8, wherein a portion of the organic layer overlaps a portion of the color filter.

11. The display device of claim 1, further comprising:
a second base facing the first base;
a common electrode disposed on a surface of the second base, the surface facing the first base; and
a liquid crystal layer disposed between the common electrode and the first pixel electrode.

12. The display device of claim 1, further comprising:
a passivation layer disposed between the first pixel electrode and the color filter.

13. The display device of claim 1, further comprising:
a second pixel electrode disposed on the organic layer, a portion of the second pixel electrode overlapping a portion of the first pixel electrode.

14. The display device of claim 1, wherein the color filter comprises an organic material.

15. A display device comprising:
a first base comprising:
a light blocking area in which a light blocking layer is disposed; and
a light transmitting area in which the light blocking layer is not disposed;
a semiconductor layer disposed on the first base in the light blocking area, the semiconductor layer comprising a source region, a drain region, and a channel region;
a first insulating layer disposed on the semiconductor layer;
a gate line disposed on the first insulating layer and extending along a first direction, a portion of the gate line overlapping a portion of the channel region;
a second insulating layer disposed on the gate line;
a first contact hole formed in the first insulating layer and the second insulating layer, the first contact hole exposing a portion of the source region;
a data line disposed on the second insulating layer and extending along a second direction intersecting the first direction, a portion of the data line contacting the portion of the source region through the first contact hole;
a third insulating layer disposed on the data line;
a second contact hole formed in the first insulating layer, the second insulating layer, and the third insulating layer, the second contact hole exposing a portion of the drain region;
a drain electrode disposed on the third insulating layer, a portion of the drain electrode contacting a portion of the drain region through the second contact hole;
a color filter disposed on the third insulating layer such that the color filter is disposed in an entirety of the light transmitting area;
a pixel electrode disposed on the color filter, a portion of the pixel electrode contacting a portion of the drain electrode; and
an organic layer disposed on the third insulating layer in the light blocking area,
wherein the organic layer is horizontally adjacent to the third insulating layer and the color filter, and horizontally overlaps the third insulating layer and the color filter in a direction substantially parallel to an upper surface of the first base.

16. The display device of claim 15, wherein an upper surface of the organic layer is substantially coplanar with an upper surface of the pixel electrode, and
wherein a distance from a surface of the first base to the upper surface of the organic layer is substantially equal to a distance from the surface of the first base to the upper surface of the pixel electrode.

17. The display device of claim 15, wherein the organic layer comprises a photosensitive organic material.

18. A method of manufacturing a display device, the method comprising:
forming a semiconductor layer on a first base, the semiconductor layer comprising a source region, a drain region, and a channel region;
forming a first insulating layer on the semiconductor layer;
forming a gate line on the first insulating layer, the gate line extending along a first direction, a portion of the gate line overlapping a portion of the channel region;
forming a second insulating layer on the gate line;
forming, in the first insulating layer and the second insulating layer, a first contact hole exposing a portion of the source region;
forming a data line on the second insulating layer, the data line extending along a second direction intersecting the first direction, a portion of the data line contacting the portion of the source region through the first contact hole;
forming a third insulating layer on the data line;
forming, in the first insulating layer, the second insulating layer, and the third insulating layer, a second contact hole exposing a portion of the drain region;
forming a drain electrode on the third insulating layer, a portion of the drain electrode contacting the portion of the drain region through the second contact hole;
forming a color filter on the third insulating layer such that the color filter does not overlap the second contact hole;
forming a pixel electrode on the color filter, a portion of the pixel electrode contacting a portion of the drain electrode; and
forming an organic layer on the third insulating layer and the pixel electrode,
wherein the organic layer is horizontally adjacent to the third insulating layer and the color filter, and horizontally overlaps the third insulating layer and the color filter.

19. The method of claim 18, wherein:
an upper surface of the organic layer is formed substantially coplanar with an upper surface of the pixel electrode;
the organic layer comprises a photosensitive organic material; and
the organic layer is at least partially formed via a photolithography process.

20. The method of claim 18, further comprising:
forming a light blocking layer on the first base;
forming, before forming the semiconductor layer, a buffer layer on the light blocking layer,
wherein the semiconductor layer is formed on the buffer layer such that the semiconductor layer overlaps a portion of the light blocking layer.

* * * * *